United States Patent
Fang

(10) Patent No.: US 9,944,829 B2
(45) Date of Patent: Apr. 17, 2018

(54) HALITE SALTS AS SILICON CARBIDE ETCHANTS FOR ENHANCING CMP MATERIAL REMOVAL RATE FOR SIC WAFER

(71) Applicant: Treliant Fang, Dublin, CA (US)

(72) Inventor: Treliant Fang, Dublin, CA (US)

(*) Notice: Subject to any disclaimer, the term of this patent is extended or adjusted under 35 U.S.C. 154(b) by 0 days.

(21) Appl. No.: 15/332,966

(22) Filed: Oct. 24, 2016

(65) Prior Publication Data

US 2017/0158911 A1    Jun. 8, 2017

Related U.S. Application Data

(60) Provisional application No. 62/386,492, filed on Dec. 3, 2015.

(51) Int. Cl.

| | |
|---|---|
| *B44C 1/22* | (2006.01) |
| *C23F 1/00* | (2006.01) |
| *C03C 15/00* | (2006.01) |
| *C03C 25/68* | (2006.01) |
| *H01L 21/302* | (2006.01) |
| *H01L 21/461* | (2006.01) |
| *C09K 13/00* | (2006.01) |
| *C09G 1/02* | (2006.01) |
| *B24C 11/00* | (2006.01) |
| *H01L 21/321* | (2006.01) |
| *C09G 1/00* | (2006.01) |
| *C09G 1/04* | (2006.01) |
| *H01L 21/02* | (2006.01) |
| *H01L 21/306* | (2006.01) |

(52) U.S. Cl.
CPC ............ *C09G 1/02* (2013.01); *B24C 11/00* (2013.01); *C09G 1/00* (2013.01); *C09G 1/04* (2013.01); *H01L 21/02013* (2013.01); *H01L 21/02024* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 3,466,208 A | 9/1969 | Slominski | |
| 5,032,203 A | 7/1991 | Doy | |
| 5,302,368 A * | 4/1994 | Harato | C01F 7/023 423/111 |
| 5,527,423 A * | 6/1996 | Neville | C23F 3/00 106/3 |
| 6,113,692 A | 9/2000 | Jaussaud | |
| 7,678,700 B2 | 3/2010 | Desai | |
| 7,998,866 B2 | 8/2011 | White | |
| 8,247,328 B2 | 8/2012 | White | |
| 8,277,671 B2 | 10/2012 | Everson | |
| 8,557,133 B2 | 10/2013 | Singh | |
| 8,821,986 B2 | 9/2014 | Weidman | |
| 9,085,714 B2 | 7/2015 | Yoshida | |
| 9,343,321 B2 | 5/2016 | Wang | |
| 2003/0132420 A1* | 7/2003 | Yadav | C09K 3/1409 252/79.1 |
| 2008/0026583 A1* | 1/2008 | Hardy | B24B 37/044 438/693 |
| 2008/0305718 A1 | 12/2008 | Kawata | |
| 2010/0144149 A1* | 6/2010 | Ward | C09G 1/02 438/693 |
| 2010/0279506 A1* | 11/2010 | White | C09G 1/02 438/693 |
| 2013/0324015 A1* | 12/2013 | Asano | B24B 37/044 451/59 |

OTHER PUBLICATIONS

Zhize Zhu et al, Tribochemical polishing of silicon carbide in oxidant solution. WEAR 1999, p. 848 in the Abstract, vol. 225-229.Elsevier, Amsterdam, The Netherlands.
WHO-EHC-216.pdf, Year 2000, Table 1, p. 29. Documents of World Health Organization, Geneva, Switzerland.
Retrived from the Internet, <URL:http://www. iiviadvmat.com/SiC-products/SiC-Products.html> II-VI Advanced Materials, Press Release Jul. 16, 2015.
Gomez, F. J. et al, Rapid thermal annealing behavior of Amorphous SiC layers deposited by electron cyclotron resonance plasma. J. Electrochemical Soc., 1996, p. 273, Figure 4. vol. 143(1). Pennington, New Jersey, USA.
Zhize Zhu et al, Tribochemical polishing of silicon carbide in oxidant solution. Wear 225-229(1999) p. 848. Abstract. Elsevier, Amsterdam, The Netherlands.
WHO-EHC-216.pdf , World Health Organization, Geneva, 2000 Table 1, p. 29.

(Continued)

*Primary Examiner* — Stephanie P Duclair
(74) *Attorney, Agent, or Firm* — Hankin Patent Law, APC; Susan L. McCain; Sergio Becerra

(57) ABSTRACT

Silicon carbide (SiC) etchants with a generic formula of $MXO_2$, where M is an alkali metal, X is a halogen, O is oxygen are disclosed. When mixed with an abrasive powder in an aqueous slurry form, this $MXO_2$ etchant acts as tribochemical reactant in enhancing the SiC material removal rate during chemical mechanical polishing (CMP). The material removal rates can sometimes go up to a few order of magnitudes, as compared to the slurry without this $MXO_2$ etchant. Typical metal in the formula $MXO_2$ are K (potassium) and Na (sodium), X includes Cl (chlorine), Br (bromine) and I (iodine). The whole series of $MXO_2$ compounds belong to the chemical family of metal halites or ammonium halites. Sodium chlorite, $NaClO_2$, the simplest and most available member of the halite family, is a typical example. The enhanced polishing rate can be utilized to significantly increase the throughput of CMP operation for non-oxide wafer polishing. The polishing waste water from the CMP process can be treated with ease in the waste water treatment facilities because of the absence of toxic heavy metal ions in the polishing formulations.

19 Claims, No Drawings

(56) References Cited

OTHER PUBLICATIONS

Retrieved from the Internet <URL:http://www.iiiadvmat.com/SiC-products/SiC-Products.html>, II-VI Advanced Materials Press Release Jul. 16, 2015.
Gomez, F. J. et al, Rapid Thermal Annealing Behavior of Armorphous SiC Layers Deposited by Electron Cyclotron Resonance Plasma J. Electrochem. Soc., vol. 143(1) (1996) Figure 4. p. 273, Pennington, New Jersey, USA.

* cited by examiner

HALITE SALTS AS SILICON CARBIDE ETCHANTS FOR ENHANCING CMP MATERIAL REMOVAL RATE FOR SIC WAFER

CROSS-REFERENCE TO RELATED U.S. APPLICATIONS

Provisional application No. 62/386,492, filed on Dec. 3, 2015.

FIELD OF THE INVENTION

This invention relates, in general, to the preparation of a non-oxide semiconductor polishing formulation and more particularly, to a fast silicon carbide chemical-mechanical polishing slurry that is useful for silicon carbide wafer polishing.

BACKGROUND OF THE INVENTION

Silicon carbide (SiC) power devices offer better high temperature and much higher electric breakdown performance have drawn much attention recently. Either used singly or used in combination with other non-oxide semiconductor layers such as gallium nitride (GaN) to enhance the power device performance, are common practice in devices fabrication. The first step for such devices fabrication is to prepare a clean, flat semiconductor surface such that the fabrication process can proceed further or to recover the mis-processed surface so that the desired process can be repeated and continued. The flat SiC surface can be prepared, for example, by a chemical-mechanical polishing (CMP) process. U.S. Pat. Nos. 7,998,866 and 7,678,700 teach how water soluble oxidizers can effectively polish SiC in the presence of abrasive particles dispersed in water. While effective, the art did not address the potential toxic waste and tool staining issues that may cause during process, by the best of the proposed chemical-mechanical polishing slurry compositions. In particular, oxidizers such as permanganate, chromate, and ammonium cerium nitrate, which are the key components in the prior art, for examples, are toxic to the environment as well as causing staining to the CMP tool parts, when in close contact with the tools during polishing operation. The most obvious staining occurs on the lapping pads, resulting in dark markings that requires frequent and tedious acid cleaning. Chromate is a biohazard, see Bioremediation of Heavy Metal Toxicity—With Special Reference To Chromium, S. Ray and M. K. Ray, Al Ameen, J. Med. Sci. (2009) 2 (2) Special: 57-63. Manganese salts are toxic and known neuron toxin, see Manganese in Drinking-water, background document for development of WHO Guidelines for Drinking-water Quality, 2011. U.S. Pat. No. 8,557,133 teaches a different approach by using dichromate or permanganate indirectly, to generate soft particles as accelerator to enhance SiC removal during CMP. In another US Patent application, U.S. 2008/0305718, showed how the chlorite, chlorate, and perchlorate salts tested that failed to achieve significant SiC removal during CMP, under the published test conditions. In yet another patent, U.S. Pat. No. 8,247,328, the inventors showed that how the oxidizer-based SiC polishing slurries can be further improved by adding significant amounts of heavy metal catalysts, such as cobalt or platinum, to enhance SiC removal. By doing so the slurries would become even more toxic and more expensive, because of the presence of the extra added heavy and noble metals in the products.

Thus, it is therefore desirable to have a need for alternative CMP formulations that uses no heavy metal-containing oxidizers, produces less staining to the tool, cost effective, requiring no special waste treatment after use, and yet delivers good SiC CMP polishing performance.

BRIEF SUMMARY OF THE INVENTION

A polishing formulation useful for non-oxide wafer polishing is disclosed, which comprises a mixture including at least an $MXO_2$ etchant; and a dispersion of high purity abrasive particles having a Mohs hardness of at least about 7, in an aqueous formulation at a proper pH, at a proper mixing ratio of the etchant to the abrasive, and at proper concentrations of the etchant and the abrasive. The inventor had discovered a series of water soluble halite silicon carbide etchants with a generic formula of $MXO_2$, wherein M is a metal or ammonium, selected from the group consisting of monovalent cations, divalent cations, and trivalent cations; preferably M is selected from the alkali metal group consisting of sodium, potassium, ammonium, lithium, and mixtures thereof. More preferably M is selected from the group consisting of sodium, potassium, and mixtures thereof; and X is selected from the halogen group consisting of chlorine, bromine, iodine, and mixtures thereof, and O is oxygen. The halite salts $MXO_2$ can, at certain pH and in the presence of certain abrasive particles, accelerate SiC polishing during CMP, with less undesirable staining effects to the lapping pads and with less undesirable post-polishing environmental effects. One of the most cost-effective $MXO_2$, for example, is sodium chlorite, $NaClO_2$, which can be easily reduced to harmless salts when treated by addition of sodium sulfite in the waste stream after use. The resulting neutralized waste contains only non-toxic sodium chloride (table salt) and sodium sulfate after alumina removal. These benign sodium salts can be easily disposed off, which is in sharp contrast to the toxic manganese, chromium and cerium salts that were used in formulations of the prior art.

DETAILED DESCRIPTION OF THE INVENTION

The following guidelines were established prior to conducting screening tests for formulating an effective SiC CMP slurry:
1. Fast material removal rate (MRR), at least >500 nm/hr for the Si[0001] plane of single crystal 4H-SiC or 6H-SiC wafer.
2. Compatible with current non-oxide semiconductor (e.g., SiC and GaN) polishing processes.
3. No need for corrosive CMP pad cleanup after polishing.
4. Smooth surface finish(surface roughness<1 nm) without micro scratches after CMP.
5. Less staining to CMP pad and tool parts than the heavy metal-containing slurry.
6. Simple slurry waste treatment, leaving no toxic heavy metal residues in the waste stream.

All the criteria listed above were met by a slurry formulated from a mixture of $MXO_2$ etchant (the halite salt) and an aqueous nano-sized alpha alumina dispersion. Selection of the cation M is not critical, other than the solubility and toxicity considerations, commercial availability being the dictating factor. For example, $MXO_2$ etchant is a metal chlorite ($MClO_2$), where M is an alkali metal (Na, K) or ammonium ($NH_4$), and X is chlorine. For another example, the $MXO_2$ etchant is a metal bromite ($MBrO_2$), where M is an alkali metal (Na,K), or ammonium ($NH_4$), and X is bromine. Specific examples of $MXO_2$ comprise, but are not limited to sodium chlorite ($NaCl_2$), potassium chlorite ($KClO_2$), sodium bromite ($NaBrO_2$), potassium bromite ($KBrO_2$), or a combination thereof. The preferred $MXO_2$ is sodium chlorite, where M=Na, X=Cl, i.e., $NaClO_2$. Other halites such as ammonium chlorite ($NH_4ClO_2$) or sodium bromite ($NaBrO_2$) showed similar effects but offers no additional benefits, because sodium chlorite is the lowest cost available chlorite and it also exhibits a high solubility at room temperature and chemical stability under relatively low pH (pH<7). Bromites, for example, tend to decompose at wider pH(pH<8) ranges, see U.S. Pat. No. 5,032,203, in a different non-SiC polishing application. For this reason, formulations containing bromite may have to be adjusted to a pH that is not for the optimum etching performance rather than to preserve the bromite concentration in the polishing formulation. Both sodium chlorite and sodium bromite had been used in CMP slurries for non-SiC polishing applications; it is therefore surprising to discover that under specific conditions, the halite salts can actually etch the seemingly indestructible silicon carbide substrates at useful etch rates (MRR>200 nm/hr). In a prior US Patent application, US 2008/0305718, for example, sodium chlorite was tested under a specific condition (pH=8.8, with 40% colloidal silica and a concentration of 10 g/L $NaClO_2$), which resulted in extremely low SiC removal (MRR=6.6 nm/hr) during polishing.

While not required to practice the embodiments of this invention, the inventor offers a plausible mechanism to explain the unexpected enhanced SiC removal rate in the presence of the halites in the polishing slurry. It is proposed that the decomposition of halite anions under the extreme tribomechemical pressure in the presence of hard abrasive particles, such as nano-sized alpha alumina during CMP process, is the reason for the enhanced SiC removal rate. The SiC etching reaction occurs by the following example, as demonstrated by the chlorite anion:

$$5ClO_2^- + 5H^+ \rightarrow 4ClO_2 + HCl + 2H_2O \quad [1]$$

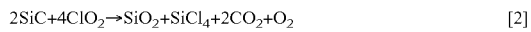

$$2SiC + 4ClO_2 \rightarrow SiO_2 + SiCl_4 + 2CO_2 + O_2 \quad [2]$$

Equation [1] proceeds readily in solution phase, under high acidity (pH<4), even without other physical forces such as the tribochemical and tribomechanical forces, as is evident by the presence of yellowish color of chlorine dioxide in the polishing solution. Under low acidity(high pH), particularly when pH>4, however, it is not obvious to optically detect the presence of free chlorine dioxide, because of its low concentration in the solution. SiC removal rate data reveals that the maximum material removal rate (MRR) occurs when there is no obvious presence of free chlorine dioxide in the fast working slurries. This suggests that the optimum SiC etching occurs when the halogen dioxide generated is in the close proximity to the polishing surfaces under specific tribomechanical conditions, i.e, in the presence of abrasive particles under pressure, and with sufficient amount of available halite ions in proximity, at relatively high solution pH. Under such conditions, the in-situ generated halogen dioxide etchant is always in close contact with both the abrasive and the silicon carbide surfaces, where the SiC etching proceeds most effectively by the above equation [2].

it is therefore understood to those skill in the art that an SiC polishing agent can be formulated in various forms as long as it meets the following key requirements:
1. A halite salt in sufficiently high concentration in the slurry;
2. A proper slurry solution pH, at which the majority of halite in the polishing formulation can be induced to release the active etchant, halogen dioxide, by a tribomechanical and/or tribochemical action;
3. An abrasive agent with a proper size and hardness in a concentration high enough to trigger the required tribomechanical or tribochemical reaction during a chemical-mechanical polishing process with SiC or other non-oxide wafers.

It is well known that free chlorine dioxide can be toxic and reactive, therefore preferably all slurry formulations have to avoid generating this reactive gas during operation and storage. Fortunately the optimum pH (pH>4) at which the slurry becomes active is well above where the free chlorine dioxide is allowed to accumulate to an unsafe level. Nevertheless, safety measures such as adequate ventilation, acidification prior to use, and avoid exposure to sunlight are routine practices that are commonly practiced by those skill in the art for safe handling of halogen dioxide solutions. Hence, in the present disclosure, the acidity (pH) of the mixture can be about pH 3 to pH 8; and preferably is about pH 4 to pH 6.

Other forms of polishing formulation packages, such as those inspired by U.S. Pat. No. 8,673,297, with abrasive powder and halite salt packaged under anhydrous and vacuum conditions in proper tablet form, is also a practical alternative to reducing hazards of accidental chlorine dioxide releases during polishing formulation storage.

Slurry performance tests also revealed the requirement of a minimum concentration of halite anion in the polishing formulation, below which nearly no SiC removal can be realized. Herein, the concentration of $MXO_2$ can be about 11 g to about 200 g/L, and preferably about 20 to about 100 g/L. Test data indicated that this minimum concentration is about 20 g/L for sodium chlorite. This is an important finding because most of commercial CMP slurries on the market do contain biocides to control bacterial growth in the polishing formulations. One of the most effective biocides used in conventional slurry formulations (albeit none for SiC CMP applications) is sodium chlorite, because of its effectiveness in low concentrations as biocide, see, for example, U.S. Pat. Nos. 6,750,257 and 6,447,563. The concentrations of sodium chlorite in the polishing formulations for biocidal purpose is between 50-1200 ppm, see 68th JECFA by Ecolab Inc., USA, December 2006. This is not to be confused with the present invention, in which a high concentration (up to more than hundred grams per liter) of sodium chlorite is used to achieve desirable SiC polishing rates during CMP.

The polishing formulation of the present invention, which is based on an aqueous solution of halite salts and a dispersion of abrasive powder, though works well as it is, may optionally be further modified without departing from the scope of the present invention. Herein, the ratio of the $MXO_2$ etchant to the high purity abrasive particles in the mixture is not particularly limited, and can be about 1:1 to about 1:10 on a weight bases, or about 1:1 to about 1:3 on a weight basis. The preferred abrasive is alumina but any high purity abrasives having a Mohs hardness of at least about 7, and preferably having a Mohs hardness of about 8 and above would work. Particularly, fine particles (10 to 1000 nm in diameter) of other abrasives such as diamond, cubic boron nitride, and boron carbide, silicon carbide, $SiO_2$, $Cr_2O_3$, $ZrO_2$, $CeO_2$, may also be mixed into the alumina-containing polishing formulations to improve the tribomechanical performance of the halite-containing slurry. Diamond particles (Mohs hardness 10), for example, have been widely used in lapping SiC (Mohs hardness 9) with fast removal rate but yielded a highly scratched rough surface that normally would require many hours of further fine CMP polishing to achieve a smooth working surface. Although much more smooth polished surface can be achieved by using nano-size ultra dispersed diamond, see for example, U.S. Pat. No. 9,343,321, it could be a cost disadvantage from manufacturing point of view. On the other hand, if a softer alpha alumina (Mohs hardness 8) is used without a halite salt in the slurry, no significant SiC polishing would have occurred. However, in the presence of sodium chlorite, even the softer alpha alumina can effectively polish the harder carbide surface. In some embodiments, the high purity abrasive particles are alpha alumina with Mohs hardness 8. The polished surface generally has a low surface roughness (Ra<0.5 nm), which is preferable to the rough surface finish when diamond powder was the only abrasive used without the halite salts for the enhanced etching. When an even softer colloidal silica (Mohs hardness 7) or spherical silica, was used in the slurry, with the same concentrations of chlorite, the removal rate was drastically reduced to approximate 1/5 or more as compared to that of the original harder alpha alumina-containing slurry. In some embodiments, the high purity abrasive particles are silica with Mohs hardness 7. It was also demonstrated that by replacing the alpha alumina with a softer gamma alumina of similar particle size, the slurry also resulted in poor SiC removal.

The alpha alumina abrasive used in this invention is preferably an alpha alumina of high chemical purity (>99%) and had been subjected to a sintering temperature higher than about 1100 C, after which the density of the alumina is greater than about 3.85 gm/cc, with a BET specific area of less than 25 $m^2/g$. The grain size of the alpha alumina is between 1 nm to 1000 nm, with the preferred grain size of about 10-1000 nm, and with the most preferred grain size of 50-400 nm. In one embodiment, the high purity alpha alumina has a grain size of about 200 nm and a specific surface area of about 6 $m^2/g$. In another embodiment, the high purity alpha alumina has a grain size of about 50 nm and a specific surface area of about 15 $m^2/g$. In yet another embodiment, the high purity alpha alumina has a grain size of about 300 nm and a specific surface area of about 5.5 $m^2/g$. There are good reasons for selecting alumina with such tight specification for non-oxide semiconductor surface polishing, which includes SiC and GaN, because of the following:
(1) Lower purity alumina not just contaminates the polishing surface, it exhibits lower hardness due to the softer impurity (glassy phase) formation during the gamma to alpha phase transformation.
(2) The higher the sintering temperature, the more complete conversion to the desired alpha phase hard alumina has resulted.
(3) Pure alpha alumina has a density of 3.97 gm/cc. The higher the density of the alumina used in the polishing formulation, the higher concentration of the hard alpha phase alumina is in the formulation.
(4) BET specific area is an indicator for internal porosity of the alumina. The higher the BET specific area, the worse the performance of polishing, because the force intends to abrade the SiC surface is used instead, to crush the alumina grain due to the excessive porosity that weakens the grain. Nano size alumina with a BET specific area of less than 25 $m^2/g$ is considered to be the alumina with acceptable internal porosity. The specific areas of the alpha alumina powders evaluated in this invention were all smaller than 25 $m^2/g$. Specifically, The 50 nm alumina exhibits a BET specific area of 15 $m^2/g$; the 200 nm alumina exhibits a BET specific area of 6 $m^2/g$; and the 300 nm alumina exhibits a BET specific area of 5.5 $m^2/g$.

The actual particle size of the alpha alumina abrasive used in this invention may be significantly different from the grain size stated in the preferred embodiments, because of particle agglomeration. Theoretical modeling indicates that the material removal rate (MRR) is faster with smaller alumina sizes, when other polishing parameters are kept constant. However, experimental data may not correlate with the theoretical prediction. Alumina powder with grain sizes smaller than 50 nm tends to agglomerate, which may introduce other slurry formulation constraints. Particle size (D50) is normally much larger than the grain size for the same alumina sample tested. For example, the 200 nm grain size alpha alumina used in this invention exhibits a particle size (D50) of 3.19 um by laser diffraction measurement. Larger grain sizes (>1000 nm) alumina may not meet the specific MRR and polishing surface quality requirements for production but the overall enhanced CMP polishing rates are still very significant when alpha alumina of much larger grain sizes are used in the CMP formulations in the presence of the halite salt etchants.

The physical form of the polishing compositions can be in thin watery slurry or thick toothpaste-like gel, pending on the desirable CMP polishing requirements. When extremely high solid content (for example, alumina concentration of approximately 1100 g/L) slurry is needed for small area bench polishing, a piston pump can be used for such dispensing. For most other routine CMP operations, a peristaltic pump installed inside a slurry container equipped with a propeller-type slurry agitator will be sufficient. Other special formulation packages such as pre-mixed halide-alumina-pH adjuster mixture in solid tablet form could be prepared by those skill in the art for meeting the SiC CMP application requirements.

Sodium chlorite suitable for the polishing formulations can be in a solution form or as a 80% dry solid. The solution form has an advantage because it usually contains less sodium chlorate impurity, nominally less than 0.5%. For this, it is more environmentally friendly to use solution chlorite from waste water discharge point of view. Solid sodium chlorite, such as those supplied by Occidental Chemical Co, Dallas, Tex., was used in the formulation experiments.

In summary, the inventor concluded that the an effective SiC polishing slurry of the halite-alumina mixtures could be formulated with pH at about 3 to 8 (preferably about 4 to 6; and most preferably about 4.6 to 5.6). The halite salts, $MXO_2$, could be with concentrations of about 11 g/L to 200 g/L, or more preferably at about 20 g/L to 100 g/L. In some embodiments, the concentration of $MXO_2$ is about 48 g/L. The aqueous suspension of the high purity abrasive particles such as nano-sized alpha alumina could be at about 11 g/L to 1100 g/L, or preferably at about 11 g/L to 600 g/L, or more preferably at about 40 g/L to 200 g/L. In some embodiments, the concentration of high purity abrasive particles is about 86 g/L. While working adequately with the above key formulation parameters, other non-essential performance-enhancing ingredients such as other oxidizers, dispersants, antiform, wetting agent and pH buffer can also be incorporated into the polishing formulations to enhance the polishing performance further.

EXAMPLES

The following non-limiting examples demonstrate the performance of the invention. The term "loading" means the presence of halite salt, especially, sodium chlorite, in the polishing formulation. "Low loading" means 10 g/L of sodium chlorite in the slurry, "medium loading" means 11-30 g/L of sodium chlorite in the slurry, "high loading" means >30 g/L of sodium chlorite in the slurry. All polishing experiments, except Example 17, were conducted using a SpeedFAM™ 50SPAW (Kanagawa, Japan) slurry CMP polisher with one of the four spindles holding three 4" 4H—N SiC (Si face down) wafers, spinning at 60 rpm and with 0.445 Kg/cm2 down force, at 60 mL/min slurry flow rate. SUBA800XY™ (Dow Chemical, USA) pad was used in all experiments. The slurry holder was equipped with a propeller agitator to prevent settling of the alumina particles in the polishing mixture. Polishing times were approximately 60 min. The SiC removal rates (MRR) were measured by weight loss and normalized to hourly rates. Only the highest MRR among the three loaded wafers is reported. Testing temperature was set to <32 C with a chiller to eliminate polishing pad overheating. All the abrasives used in the examples are of high purity (99.99%), alpha phase alumina with BET surface area of 15 $m^2$/g or less, except in Example 18, wherein the abrasive is a colloidal silica of 10 nm is used. In Example 17, three SiC wafers with 2.5 um epitaxial-grown GaN layer on the 4H-N SiC were used as test wafers.

Example 1. No Loading Slurry

This experiment demonstrates that there is no SiC removal if the slurry does not contain any halite salts. 37 g of a 99.99% alpha alumina with a grain size of 50 nm(Taian Health Chemical, Shandong, China) was added into 2.7 L of DI water containing 0.1% of an ethoxylate surfactant. The mixture was then homogenize with a high speed blender and the pH of the slurry was adjusted to 3.7 with hydrochloric acid. The slurry was then dispensed onto the CMP tool. SiC material removal measurements showed no measurable material removal(<20 nm/hr) after 45 min polishing.

Example 2. Low Loading Slurry

This experiment demonstrates that there will be some SiC removal if the slurry contains sodium chlorite. 27 g of sodium chlorite and 35.5 g of a 99.99% alpha alumina with a 50 nm grain size (Taian Health Chemical, Shandong, China) were added into 2.0 L of DI water containing 0.1% of an ethoxylate surfactant. The mixture was then homogenize with a high speed blender and pH adjusted to 3.81 with hydrochloric acid. The final volume of the mixture was adjusted to 2.7 L. The slurry was then dispensed onto the CMP tool. SiC material removal rate was measured to be 121 nm/hr (normalized to one hour) after 45 min polishing.

Example 3. Medium Loading Slurry

This experiment demonstrates that there will be more SiC removal if the slurry contains more sodium chlorite. 51 g of sodium chlorite and 73.5 g of a 99.99% alpha alumina with a 50 nm grain size (Taian Health Chemical, Shandong, China) were added into 2.2 L of DI water containing 0.1% of an ethoxylate surfactant. The mixture was then homogenize with a high speed blender and pH adjusted to 3.71 with hydrochloric acid. The final volume of the mixture was adjusted to 2.7 L. The slurry was then dispensed onto the CMP tool. SiC material removal rate was measured to be 348 nm/hr (normalized to one hour) after 45 min polishing.

Example 4. Medium Loading Slurry

This experiment demonstrates that there will be more SiC removal if the slurry contains more sodium chlorite and more alumina. 60 g of sodium chlorite and 100 g of a 99.99% alpha alumina with a 50 nm grain size (Taian Health Chemical, Shandong, China) were added into 2.2 L of DI water containing 0.1% of an ethoxylate surfactant. The mixture was then homogenize with a high speed blender and pH adjusted to 3.72 with hydrochloric acid. The final volume of the mixture was adjusted to 2.7 L. The slurry was then dispensed onto the CMP tool. SiC material removal was measured to be 769 nm/hr (normalized to one hour) after 45 min polishing.

Example 5. High Loading Slurry with Low pH

This experiment demonstrates that there will be only small incremental gain in SiC removal rate after high concentrations of both alumina and chlorite were added in the slurry. 130 g of sodium chlorite and 165 g of a 99.99% alpha alumina with a 50 nm grain size (Taian Health Chemical, Shandong, China) were added into 3 L of DI water containing 0.1% of an ethoxylate surfactant. The mixture was then homogenize with a high speed blender and pH adjusted to 3.72 with hydrochloric acid. The final volume of the mixture was adjusted to 3.5 L. The slurry was then dispensed onto the CMP tool. SiC material removal was measured to be 788 nm/hr after 50 min polishing (normalized to one hour).

Example 6. High Loading Slurry with Higher pH

This experiment demonstrates that there will be no improvement in SiC removal after the slurry reaches its highest removal rate in example 5. 150 g of sodium chlorite and 225 g of a 99.99% alpha alumina with a 50 nm grain size (Taian Health Chemical, Shandong, China) were added into 3 L of DI water containing 0.1% of an ethoxylate surfactant. The mixture was then homogenize with a high speed blender and pH adjusted to 4.62 with hydrochloric acid. The final volume of the mixture was adjusted to 3.5 L. The slurry was then dispensed onto the CMP tool. SiC material removal was measured to be 789 nm/hr (normalized to one hour) after 50 min polishing.

Example 7. Medium Loading Slurry with Low pH

This experiment demonstrates that under buffered low pH, the SiC etch rate is inhibited, even though that the polishing mixture contains a high concentration of free chlorine dioxide. 60 g of sodium chlorite and 150 g of a 99.99% alpha alumina with a 50 nm grain size (Taian Health Chemical, Shandong, China) were added into 3 L of DI water containing 0.1% of an ethoxylate surfactant. The mixture was then homogenize with a high speed blender and pH adjusted to 3.10 with hydrochloric acid and a sodium citrate buffer (20 g/L). The final volume of the mixture was adjusted to 3.5 L. At this low pH, odor of chlorine dioxide, which is generated according to equation 1, is readily detectable. The slurry was then dispensed onto the CMP tool. SiC material removal was measured to be 295 nm/hr after 50 min polishing. This experiment demonstrated that a high concentration of free chlorine dioxide in the solution phase of a polishing slurry may not deliver an effective polishing rate.

Example 8. High Loading Slurry with Low pH

This experiment is to demonstrate that under low pH and excessive chlorine dioxide in the slurry solution, the SiC etch rate is inhibited. 120 g of sodium chlorite and 100 g of a 99.99% alpha alumina with a 50 nm grain size (Taian Health Chemical, Shandong, China) were added into 3 L of DI water containing 0.1% of an ethoxylate surfactant. The mixture was then homogenize with a high speed blender and pH adjusted to 3.12 with hydrochloric acid and a sodium citrate buffer (20 g/L). The final volume of the mixture was adjusted to 3.6 L. At this low pH, odor of chlorine dioxide, which is generated according to equation 1, is readily detectable. The slurry was then dispensed onto the CMP tool. SiC material removal was measured to be 205 nm/hr after 60 min polishing.

Example 9. High Loading Slurry at Higher pH with 200 nm Alumina Powder

This experiment tests the SiC removal rate using a different grain size (200 nm) alumina powder. 163 g of sodium chlorite and 244 g of a 99.99% alpha alumina with a 200 nm grain size (Song Shan Specialty Materials, Henan, China) were added into 3 L of DI water containing 2 ppm of polyethylene glycol surfactant. The mixture was then homogenize with a high speed blender and pH adjusted to 4.64 with hydrochloric acid and the final volume was adjusted to 3.8 L. The slurry was then dispensed onto the CMP tool. SiC material removal was measured to be 608 nm/hr after 60 min polishing.

Example 10. High Loading Slurry at pH 4.62 and 200 nm Alumina Powder

This experiment tests the SiC removal rate using a 200 nm alumina with a higher abrasive loading. 304 g of a 99.99% alpha alumina with a 200 nm grain size (Song Shan Specialty Materials, Henan, China) and 163 g of sodium chlorite were added into 3 L of DI water containing 2 ppm of polyethylene glycol surfactant. The mixture was then homogenize with a high speed blender and pH adjusted to 4.62 with hydrochloric acid and the final volume was adjusted to 3.8 L. The slurry was then dispensed onto the CMP tool. SiC material removal was measured to be 960 nm/hr after 60 min polishing.

Example 11. Extra-High Loading Slurry at pH 4.65 and 200 nm Alumina Powder

This experiment tests the SiC removal rate using a 200 nm alumina at pH 4.65 and with extra-high abrasive loading. 475 g of a 99.99% alpha alumina with a 200 nm grain size (Song Shan Specialty Materials, Henan, China) and 162.9 g of sodium chlorite were added into 3 L of DI water containing 2 ppm of polyethylene glycol surfactant. The mixture was then homogenize with a high speed blender and pH adjusted to 4.65 with hydrochloric acid and the final volume was adjusted to 3.78 L. The slurry was then dispensed onto the CMP tool. SiC material removal was measured to be 980 nm/hr after 60 min polishing.

Example 12. High Loading Slurry at pH 4.59 and 200 nm Alumina Powder

This experiment tests the SiC removal rate using a 200 nm alumina at a slightly lower pH and with optimum abrasive loading. 324.7 g of a 99.99% alpha alumina with a 200 nm grain size (Song Shan Specialty Materials, Henan, China) and 180.7 g of sodium chlorite were added into 3 L of DI water containing 2 ppm of polyethylene glycol surfactant. The mixture was then homogenize with a high speed blender and pH adjusted to 4.59 with hydrochloric acid and the final volume was adjusted to 3.78 L. The slurry was then dispensed onto the CMP tool. SiC material removal was measured to be 1120 nm/hr after 60 min polishing.

Example 13. High Loading Slurry at pH 5.6 and 200 nm Alumina Powder

This experiment tests the SiC removal rate using a 200 nm alumina at a higher pH and abrasive loading. 364 g of a 99.99% alpha alumina with a 200 nm grain size (Song Shan Specialty Materials, Henan, China) and 180 g of sodium chlorite were added into 3 L of DI water containing 2 ppm of polyethylene glycol surfactant. The mixture was then homogenize with a high speed blender and pH adjusted to 5.6 with hydrochloric acid and the final volume was adjusted to 3.8 L. The slurry was then dispensed onto the CMP tool. SiC material removal was measured to be 776 nm/hr after 60 min polishing.

Example 14. High Loading Slurry at pH 6.35 and 200 nm Alumina Powder

This experiment tests the SiC removal rate using a 200 nm alumina at an even higher pH and with optimum abrasive loading. 325 g of a 99.99% alpha alumina with a 200 nm grain size (Song Shan Specialty Materials, Henan, China) and 180.7 g of sodium chlorite were added into 3 L of DI water containing 2 ppm of polyethylene glycol surfactant. The mixture was then homogenize with a high speed blender and pH adjusted to 6.35 with hydrochloric acid and the final volume was adjusted to 3.78 L. The slurry was then dispensed onto the CMP tool. SiC material removal was measured to be 490 nm/hr after 60 min polishing.

Example 15. High Loading Slurry at pH 4.62 and 300 nm Alumina Powder

This experiment tests the SiC removal rate using a larger grain size (300 nm) alumina at an optimum pH and with optimum abrasive loading. 328.9 g of a 99.99% alpha alumina with a 300 nm grain size (Song Shan Specialty Materials, Henan, China) and 163.2 g of sodium chlorite were added into 3 L of DI water containing 2 ppm of polyethylene glycol surfactant. The mixture was then homogenize with a high speed blender and pH adjusted to 4.62 with hydrochloric acid and the final volume adjusted to 3.78 L. The slurry was then dispensed onto the CMP tool. SiC material removal was measured to be 800 nm/hr after 60 min polishing.

Example 16. High Loading Slurry at Higher pH with 200 nm Alumina and Sodium Bromite Etchant This experiment tests the SiC removal rate using a 200 nm alumina and a different halite, sodium bromite (Shandong Tianxin Chemical Co., Shandong, China) as the etchant. 327 g of a 60% $NaBrO_2$ solution and 306 g of a 99.99% alpha alumina with a 200 nm grain size (Song Shan Specialty Materials, Henan, China) were added into 3.5 L of DI water containing 2 ppm of a polyethylene glycol surfactant. The mixture was then homogenize with a high speed blender and pH adjusted to 5.13 with hydrochloric acid with a final volume adjusted to 4.0 L. The slurry was then dispensed onto the CMP tool. SiC material removal was measured to be 868 nm/hr after 60 min polishing. Attempts to further reducing the pH of the slurry with the same composition were not successful due to the presence of dangerous level of bromine produced by excessive acidification.

Example 17. Demonstration of Slurry Compatibility with Gallium Nitride on SiC

This experiment demonstrates that SiC substrate recovery is compatible with GaN film on SiC. An SiC wafer with 2.5 um epitaxial-grown GaN layer on a 4H-N SiC was used as test wafer. All CMP parameters were the same as for other examples stated above, except polishing was tested on the GaN side of the test wafer. The slurry used comprises 200 nm alumina at a pH of 4.85 and with optimum abrasive loading. 325 g of a 99.99% alpha alumina with a 200 nm grain size (Song Shan Specialty Materials, Henan, China) and 180.7 g of sodium chlorite were added into 3 L of DI water. The mixture was then homogenize with a high speed blender and pH was adjusted to 4.85 with sulfuric acid and final volume was adjusted to 3.78 L. The slurry was then dispensed onto the CMP tool. GaN material removal was measured to be 1578 nm/hr after 60 min polishing. Continual polishing of the same substrate eventually exposed the GaN—SiC interface, which can be detected optically by the presence of Newton rings. More polishing completely removed the GaN with only the SiC surface remained.

Example 18. High Loading Slurry at pH 4.59 and 10 nm Colloidal Silica

This experiment tests the SiC removal rate using a colloidal silica of 10 nm size at an optimum pH and with excessively high abrasive loading. 3.57 L of a colloidal silica suspension with 800 g/gallon solid content with 10 nm grain size was added 181 g of sodium chlorite. The mixture was then pH adjusted with 15% sulfuric acid to pH 4.59 and a final volume of 3.78 L. The slurry was then dispensed onto the CMP tool. SiC material removal was measured to be 160 nm/hr after 60 min polishing.

The following table summarizes the results of the above experimental findings.

By now I have demonstrated that mixtures of high-purity alpha alumina with three different sizes (50 nm, 200 nm and 300 nm) and with various concentrations of sodium chlorite or sodium bromite in aqueous slurry form, can remove silicon carbide substrate's Si face effectively under proper pH, using a commercial CMP tool with proper polishing parameters. Specifically, Example 12 of the above table achieved an SiC MRR of 1120 nm/hr, at pH 4.59 and at sodium chlorite and nano-size alpha alumina concentrations of 47.8 g/L and 85.9 g/L, respectively, with a halite to abrasive mixing ratio at 1 to 1.797. These non-limiting examples can be modified or altered further by addition of other performance enhancing agents, if necessary, without departing from the original scope of the invention of using halite salts in abrasive slurries as the etchant for effective removal of non-oxide semiconductor surfaces, including SiC, during chemical-mechanical polishing operations. The demonstration of effective removal of GaN on SiC stacking under the same polishing condition as for SiC also suggests that this alumina-halite polishing composition can be a generic CMP solution for most other non-oxide wafer polishing applications as well.

I claim:
1. An aqueous polishing formulation for polishing a substrate comprising at least one single crystal silicon carbide layer, the formulation comprising:
  from about 11 g/L to about 200 g/L of an $MXO_2$ etchant, wherein M is a metal or ammonium, X is bromine or chlorine, and O is oxygen; and
  from about 11 g/L to about 600 g/L of high purity alpha alumina particles, wherein the alpha alumina particles have a Mohs hardness of at least about 7, a grain size ranging from about 50 nm to about 300 nm, and a specific surface area ranging from about 5.5 m²/g to 15 m²/g;
  wherein the ratio of the $MXO_2$ etchant to the high purity alpha alumina particles contained in the aqueous polishing formulation is from about 1:1 to about 1:10 on a weight bases;
  wherein the aqueous polishing formulation has a pH of from about 3.7 to about 6.3; and

| Data Summery | MRR nm/hr | pH | Al2O3 or SiO2^ g/L | NaClO2 or NaBrO2* g/L | Al2O3 or SiO2^ size, nm | Comments |
| --- | --- | --- | --- | --- | --- | --- |
| Example 1 | <20 | 3.70 | 13.7 | 0 | 50 | No loading |
| Example 2 | 121 | 3.81 | 13.1 | 10.0 | 50 | Low loading |
| Example 3 | 348 | 3.71 | 27.2 | 18.9 | 50 | Medium loading |
| Example 4 | 769 | 3.72 | 37.0 | 22.2 | 50 | Medium loading |
| Example 5 | 788 | 3.72 | 47.1 | 37.1 | 50 | High loading |
| Example 6 | 789 | 4.62 | 64.3 | 42.8 | 50 | High loading |
| Example 7 | 295 | 3.10 | 42.8 | 17.1 | 50 | Medium loading |
| Example 8 | 205 | 3.12 | 27.8 | 33.3 | 50 | High loading |
| Example 9 | 608 | 4.64 | 64.2 | 42.9 | 200 | High loading |
| Example 10 | 960 | 4.62 | 80.0 | 42.9 | 200 | High loading |
| Example 11 | 980 | 4.65 | 125.7 | 43.1 | 200 | High loading |
| Example 12 | 1120 | 4.59 | 85.9 | 47.8 | 200 | High loading |
| Example 13 | 776 | 5.60 | 95.8 | 47.4 | 200 | High loading |
| Example 14 | 490 | 6.35 | 86 | 47.8 | 200 | High loading |
| Example 15 | 800 | 4.62 | 87 | 43.2 | 300 | High loading |
| Example 16 | 868 | 5.13 | 76.5 | 49.1* | 200 | High loading |
| Example 17 | 1578 GaN | 4.85 | 86 | 47.8 | 200 | High loading |
| Example 18 | 160 | 4.59 | 200^ | 48 | 10^ | High loading | wherein the aqueous polishing formulation has a polishing rate for the at least one single crystal silicon carbide layer of greater than 500 nm/hour.

2. The aqueous polishing formulation of claim 1, wherein the high purity alpha alumina particles have a grain size of about 200 nm and a specific surface area of about 6 $m^2$/g.

3. The aqueous polishing formulation of claim 2, wherein the $MXO_2$ etchant is selected from the group consisting of metal chlorites, metal bromites, ammonium chlorites, and sodium bromites.

4. The aqueous polishing formulation of claim 2, wherein the ratio of the $MXO_2$ etchant to the high purity alpha alumina particles contained in the aqueous polishing formulation is from about 1:1 to about 1:2 on a weight bases.

5. The aqueous polishing formulation of claim 2, wherein the concentration of $MXO_2$ etchant is from about 20 g/L to about 100 g/L, and the concentration of high purity alpha alumina particles is from about 40 g/L to about 200 g/L.

6. The aqueous polishing formulation of claim 2, wherein high purity alpha alumina particles having a purity of at least about 99%.

7. The aqueous polishing formulation of claim 2, wherein the aqueous polishing formulation has a polishing rate for the at least one single crystal silicon carbide layer of from about 500 nm/hour to 1200 nm/hour.

8. The aqueous polishing formulation of claim 1, wherein the high purity alpha alumina particles have a grain size of about 50 nm and a specific surface area of about 15 $m^2$/g.

9. The aqueous polishing formulation of claim 8, wherein the $MXO_2$ etchant is selected from the group consisting of metal chlorites, metal bromites, ammonium chlorites, and sodium bromites.

10. The aqueous polishing formulation of claim 8, wherein the ratio of the $MXO_2$ etchant to the high purity alpha alumina particles contained in the aqueous polishing formulation is from about 1:1 to about 1:2 on a weight bases.

11. The aqueous polishing formulation of claim 8, wherein the concentration of $MXO_2$ etchant is from about 20 g/L to about 100 g/L, and the concentration of high purity alpha alumina particles is from about 40 g/L to about 200 g/L.

12. The aqueous polishing formulation of claim 8, wherein high purity alpha alumina particles having a purity of at least about 99%.

13. The aqueous polishing formulation of claim 8, wherein the aqueous polishing formulation has a polishing rate for the at least one single crystal silicon carbide layer of from about 500 nm/hour to 1200 nm/hour.

14. The aqueous polishing formulation of claim 1, wherein the high purity alpha alumina particles have a grain size of about 300 nm and a specific surface area of about 5.5 $m^2$/g.

15. The aqueous polishing formulation of claim 14, wherein the $MXO_2$ etchant is selected from the group consisting of metal chlorites, metal bromites, ammonium chlorites, and sodium bromites.

16. The aqueous polishing formulation of claim 14, wherein the ratio of the $MXO_2$ etchant to the high purity alpha alumina particles contained in the aqueous polishing formulation is from about 1:1 to about 1:2 on a weight bases.

17. The aqueous polishing formulation of claim 14, wherein the concentration of $MXO_2$ etchant is from about 20 g/L to about 100 g/L, and the concentration of high purity alpha alumina particles is from about 40 g/L to about 200 g/L.

18. The aqueous polishing formulation of claim 14 wherein high purity alpha alumina particles having a purity of at least about 99%.

19. The aqueous polishing formulation of claim 14, wherein the aqueous polishing formulation has a polishing rate for the at least one single crystal silicon carbide layer of from about 500 nm/hour to 1200 nm/hour.

* * * * *